United States Patent
Boettiger et al.

(10) Patent No.: US 7,560,295 B2
(45) Date of Patent: Jul. 14, 2009

(54) METHODS FOR CREATING GAPLESS INNER MICROLENSES, ARRAYS OF MICROLENSES, AND IMAGERS HAVING SAME

(75) Inventors: Ulrich Boettiger, Boise, ID (US); Jin Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/510,704

(22) Filed: Aug. 28, 2006

(65) Prior Publication Data

US 2006/0292735 A1 Dec. 28, 2006

Related U.S. Application Data

(63) Continuation-in-part of application No. 11/209,695, filed on Aug. 24, 2005, now Pat. No. 7,199,931, and a continuation-in-part of application No. 11/209,758, filed on Aug. 24, 2005, now Pat. No. 7,476,562, each of which is a continuation-in-part of application No. 10/681,308, filed on Oct. 9, 2003, now Pat. No. 7,227,692, and a continuation-in-part of application No. 11/002,231, filed on Dec. 3, 2004, now Pat. No. 7,307,788.

(51) Int. Cl.
*H01L 21/00* (2006.01)

(52) U.S. Cl. ............................. 438/22; 438/48; 438/65; 438/69; 257/E27.133; 257/E27.131

(58) Field of Classification Search .................. 438/22, 438/48, 65, 69, 70; 257/432, 435; 250/208.1, 250/216

See application file for complete search history.

(56) References Cited

U.S. PATENT DOCUMENTS

| | | | |
|---|---|---|---|
| 5,074,649 A | 12/1991 | Hamanaka et al. | |
| 5,466,926 A | 11/1995 | Sasano et al. | |
| 5,536,455 A | 7/1996 | Aoyama et al. | |
| 6,140,630 A | 10/2000 | Rhodes | |
| 6,188,094 B1* | 2/2001 | Kochi et al. | 257/232 |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,734,031 B2 | 5/2004 | Shizukuishi | |
| 6,852,591 B2 | 2/2005 | Rhodes | |
| 7,012,754 B2 | 3/2006 | Boettiger et al. | |
| 7,068,432 B2 | 6/2006 | Boettiger et al. | |
| 2001/0052629 A1 | 12/2001 | Assadi et al. | |
| 2002/0176037 A1 | 11/2002 | Li | |
| 2003/0063204 A1 | 4/2003 | Suda | |
| 2003/0063210 A1 | 4/2003 | Tsuboi | |
| 2003/0210462 A1 | 11/2003 | Freese et al. | |
| 2005/0280012 A1 | 12/2005 | Boettiger et al. | |
| 2006/0027887 A1 | 2/2006 | Boettiger et al. | |
| 2006/0081955 A1* | 4/2006 | Hong | 257/432 |
| 2006/0292734 A1* | 12/2006 | Kim | 438/70 |

* cited by examiner

*Primary Examiner*—Hsien-ming Lee
(74) *Attorney, Agent, or Firm*—Dickstein Shapiro LLP

(57) ABSTRACT

Methods of fabricating a microlens and/or array of microlenses used to focus light on photosensors, by forming a protective coating over a microlenses precursor material, and etching the protective coating and microlens precursor material to obtain a predetermined shape.

21 Claims, 18 Drawing Sheets

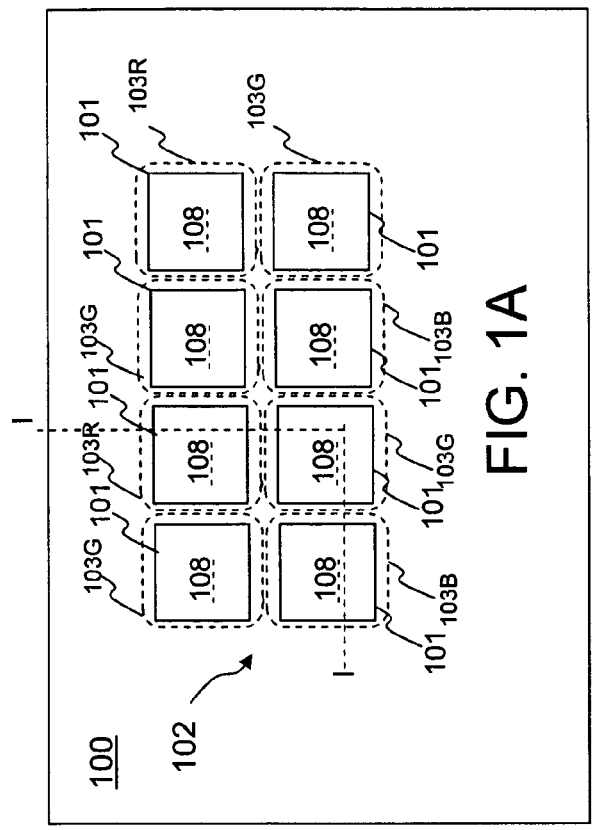
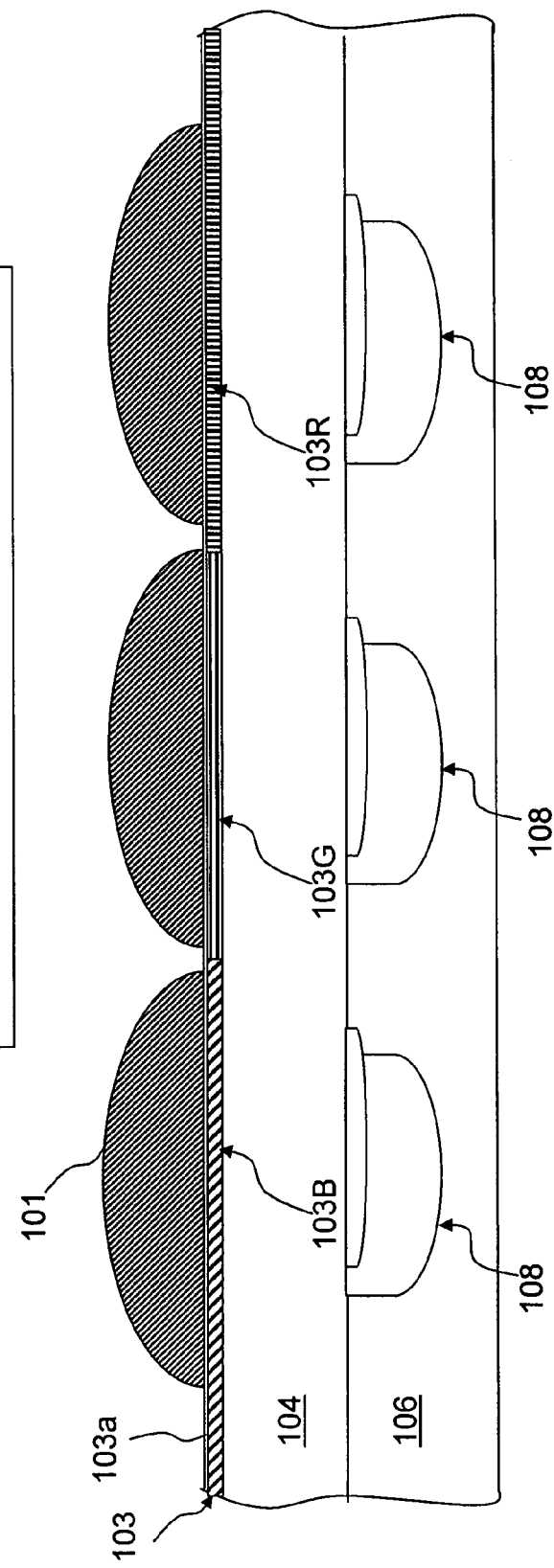
FIG. 1A
FIG. 1B

METHODS FOR CREATING GAPLESS INNER MICROLENSES, ARRAYS OF MICROLENSES, AND IMAGERS HAVING SAME

CROSS REFERENCE TO RELATED APPLICATIONS

This application is a continuation-in-part of application Ser. Nos. 11/209,695 now U.S. Pat. No. 7,199,931 and 11/209,758 now U.S. Pat. No. 7,476,562, both filed on Aug. 24, 2005, each of which is a continuation-in-part of application Ser. No. 10/681,308 now U.S. Pat. No. 7,227,692, filed Oct. 9, 2003, and application Ser. No. 11/002,231 now U.S. Pat. No.7,307,788, filed on Dec. 3, 2004, which are all hereby incorporated by reference.

FIELD OF THE INVENTION

Embodiments described herein relate to methods of fabricating solid-state imagers and, more particularly, an array of microlenses used to focus light on photosensors, and the methods of using the same.

BACKGROUND OF THE INVENTION

Solid-state imagers, including charge coupled devices (CCD) and complementary metal oxide semiconductor (CMOS) sensors have commonly been used in photo-imaging applications. A CMOS imager circuit includes a focal plane array of pixel cells, each one of the cells including a photosensor, for example, a photogate, photoconductor or a photodiode for accumulating photo-generated charge in a specified portion of the imager substrate. Each pixel cell has a charge storage region, formed on or in the substrate, which is connected to the gate of an output transistor that is part of a readout circuit. The charge storage region may be constructed as a floating diffusion region. In some imagers, each pixel cell may include at least one electronic device such as a transistor for transferring charge from the photosensor to the storage region and one device, also typically a transistor, for resetting the storage region to a predetermined charge level prior to charge transference.

In a typical CMOS imager, the active elements of the pixel cells perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel image charge. Photo-charge may be amplified when it moves from the initial charge accumulation region to the storage region. The charge at the storage region is typically converted to a pixel output voltage by a source follower output transistor.

Examples of CMOS imagers, processing steps thereof, and detailed descriptions of the functions of various CMOS elements of an imager are described, for example, in U.S. Pat. Nos. 6,140,630; 6,376,868; 6,310,366; 6,326,652; 6,204,524; 6,333,205; and U.S. Pat. No. 6,852,591, all of which are assigned to Micron Technology, Inc. The disclosures of each of the foregoing are hereby incorporated by reference in their entirety.

Microlenses collect light from a large light collecting area and focusing it onto a small photosensitive area of the photosensor. As the size of imager arrays and photosensitive regions of pixel cells continue to decrease, it becomes increasingly difficult to provide a microlens capable of focusing incident light rays onto the photosensitive regions of the pixel cell. This problem is due in part to the increased difficulty in constructing a microlens that has the optimal focal characteristics for the increasingly smaller imager device. Microlens shaping during fabrication is important for optimizing the focal point of a microlens. This in turn increases the quantum efficiency for the underlying pixel cell array.

Conventional microlens fabrication involves an intermediate lens material that is deposited in an array over a substrate and formed into a microlens array using a reflow process. Each microlens is formed with a minimum distance, typically no less than 0.3 microns, between adjacent microlenses. Any closer than 0.3 microns may cause two neighboring microlenses to bridge during reflow. Each microlens is patterned in a material layer as a single square with gaps around it. During reflow of the patterned square microlens material, a gel drop is formed in a partially spherical shape driven by the force equilibrium of surface tension and gravity. The microlenses then harden in this shape. If the gap between two adjacent gel drops is too narrow, they may touch and merge, or bridge, into one larger drop. Bridging changes the shape of the lenses, which leads to a change in focal length, or more precisely the energy distribution in the focal range. A change in the energy distribution in the focal range leads to a loss in quantum efficiency of, and enhanced cross-talk between, pixel cells.

The problem of bridging is exacerbated by recent advances in shared pixel cell architecture. For example, U.S. patent application Ser. No. 11/126,275, assigned to Micron Technology, Inc., the full disclosure of which is hereby incorporated, illustrates two-way and four-way shared pixel cells. Due to the proximity of the photosensors in a shared pixel cell architecture and non-uniform photosensor spacing and/or sizes, the fabrication of microlenses over the photosensors is more prone to bridging.

Accordingly, improved methods of fabricating microlens arrays over pixel cell arrays having uniformly or non-uniformly spaced photosensors and/or uniform or non-uniform photosensor sizes are needed.

BRIEF DESCRIPTION OF THE DRAWINGS

FIGS. 1A-1B illustrate partial top-down view and side cross-sectional views, respectively, of an imager constructed in accordance with an embodiment discussed herein.

DETAILED DESCRIPTION OF THE INVENTION

Figure 2:
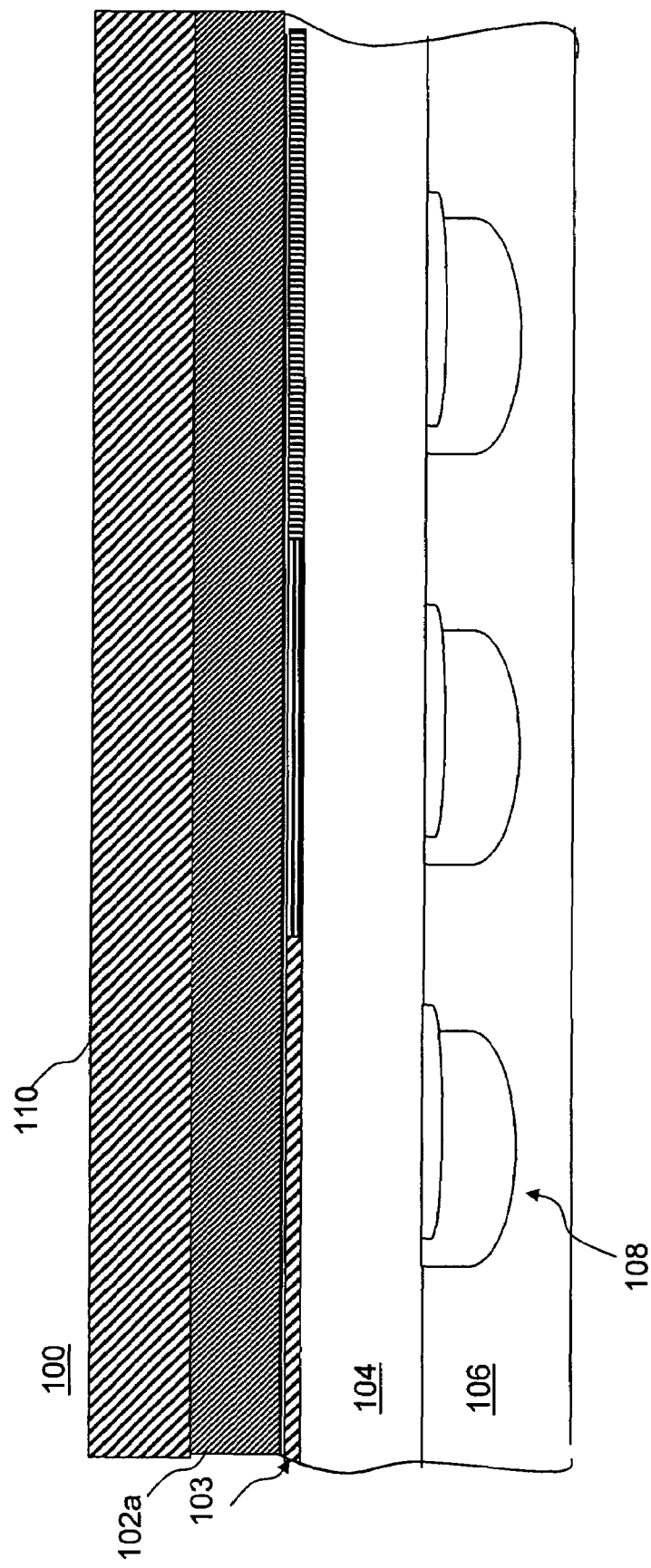
FIGS. 2-6 illustrate an embodiment of fabricating the imager illustrated in FIGS. 1A and 1B.

In the following detailed description, reference is made to the accompanying drawings, which form a part hereof and show by way of illustration specific embodiments of the invention. These embodiments are described in sufficient detail to enable those skilled in the art to practice them, and it is to be understood that other embodiments may be utilized, and that structural, logical, and electrical changes may be made. The progression of processing steps described is an example of embodiments that may be used; however, the sequence of steps is not limited to that set forth herein and may be changed as is known in the art, with the exception of steps necessarily occurring in a certain order.

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be other semiconductors including, for example, germanium or gallium arsenide. When reference is made to the semiconductor substrate in the following description, previous process steps may have been utilized to form regions, junctions, or structures in or over the base semiconductor or foundation.

The term "pixel cell," as used herein, refers to a photo-element unit cell containing a photosensor for converting photons to an electrical signal as may be employed by an imager. Although the pixel cells are illustrated herein as CMOS four-transistor (or 4-T) pixel cells, it is not intended to be limiting in any way. For example, the pixel cells could have more or less than four transistors and embodiments described herein may be employed in any type of solid-state imager, including CCD imagers and others.

The term "substantially gapless" is intended to cover not only microlens arrays having zero gaps between adjacent microlenses, but is also intended to more broadly encompass microlens arrays having substantially no gapping in areas between the microlenses. For example, a microlens array having approximately 3% or less of its surface area being space not covered by a microlens (i.e., approximately 3% or less gaps), is considered substantially gapless as used herein.

The term "microlens" as used herein refers to a transparent structure that condenses paths of wavelengths of light from a generally larger field to a generally smaller field. Microlens is intended to encompass, without limitation, spherical, aspherical, and substantially planar structures with rounded edges.

With reference to the figures, where like numerals represent like elements, FIGS. 1A and 1B illustrate a partial top-down view and side cross-sectional view, respectively, of a portion of a semiconductor-based imager 100, such as a CMOS imager, constructed in accordance with a first embodiment of the invention. As illustrated in FIG. 1A, the imager 100 includes a microlens array 102 having microlenses 101 formed over corresponding color filters 103B, 103G, 103R in the color filter array 103 (FIG. 1B). Each of the first, second, and third color filters 103B, 103G, 103R correspond to allowing a particular wavelength of light pass through to photosensors 108 formed in a substrate 106. The first, second, and third color filters 103B, 103G, 103R correspond to blue, green, and red, respectively, and could correspond to other colors, including, but not limited to cyan, magenta, and yellow.

FIG. 1B illustrates a side cross-sectional view taken along line I-I of FIG. 1A. The illustrated color filter array 103 is deposited and patterned over a passivation layer 104. The passivation layer 104 is typically formed of a nitride material, although it is not limited to nitride alone, and could comprise any transparent material layer. Unlike conventional microlenses, discussed above, the illustrated microlenses 101 of FIG. 1B are fabricated by a non-additive process (discussed below).

FIGS. 2-6 illustrate partial cross-sectional views of an embodiment of fabricating the imager 100 illustrated in FIGS. 1A and 1B. As illustrated in FIG. 2, a microlens precursor material layer 102a is selectively deposited and patterned over the photosensors 108 of the imager 100. The microlens precursor material layer 102a is formed of any transparent material that allows wavelengths of light to pass through. For example, the microlens precursor material layer 102a could be formed of glass, for example, zinc selenide (ZnSe), boro-phospho-silicate glass (BPSG), phosphosilicate glass (PSG), borosilicate glass (BSG), silicon oxide, silicon nitride, or silicon oxynitride; an optical thermoplastic material such as tantalum pentoxide (Ta2O5), titanium oxide (TiO2), polymethylmethacrylate, polycarbonate, polyolefin, cellulose acetate butyrate, or polystyrene; a polyimide; a thermoset resin such as an epoxy resin; a photosensitive gelatin; or a radiation curable resin such as acrylate, methacrylate, urethane acrylate, epoxy acrylate, or polyester acrylate. The preceding materials are only illustrative examples.

A protective material layer precursor 110 is formed over the microlens precursor material layer 102a. The protective material layer precursor 110 is formed of a photo resist material, and exposed to ultraviolet (UV) radiation using a suitable mask. Depending on the material used to form the protective material layer 110, the material is developed to either dissolve the exposed protective material (positive resist) or dissolve the unexposed protective material (negative resist).

Figure 3:
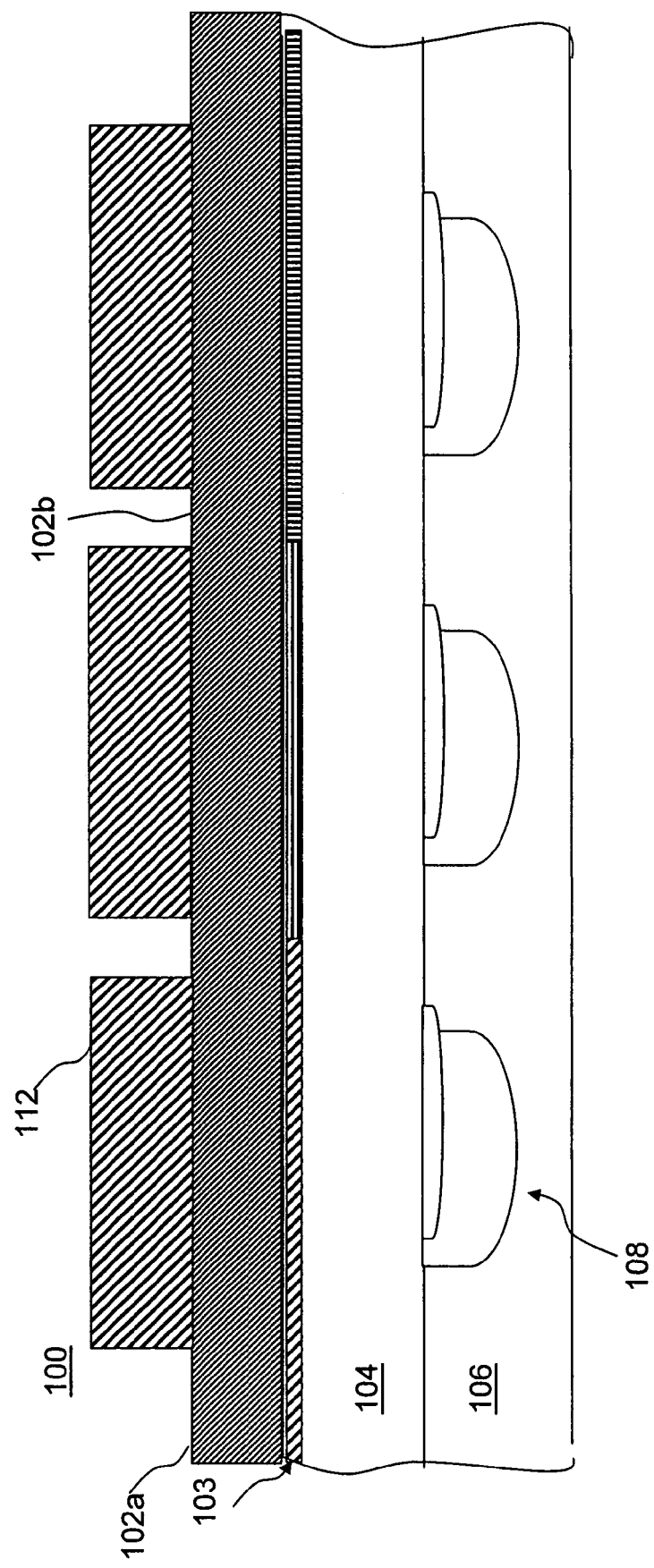

FIG. 3 illustrates the resulting structure having protective material layers 112 over portions of the microlens precursor material layer 102a. The illustrated protective material layers 112 are substantially aligned with the photosensors 108 formed in association with the substrate 106. As illustrated, portions 102b of the microlens precursor material layer 102a are exposed and not covered by the protective material layers 112.

Figure 4:
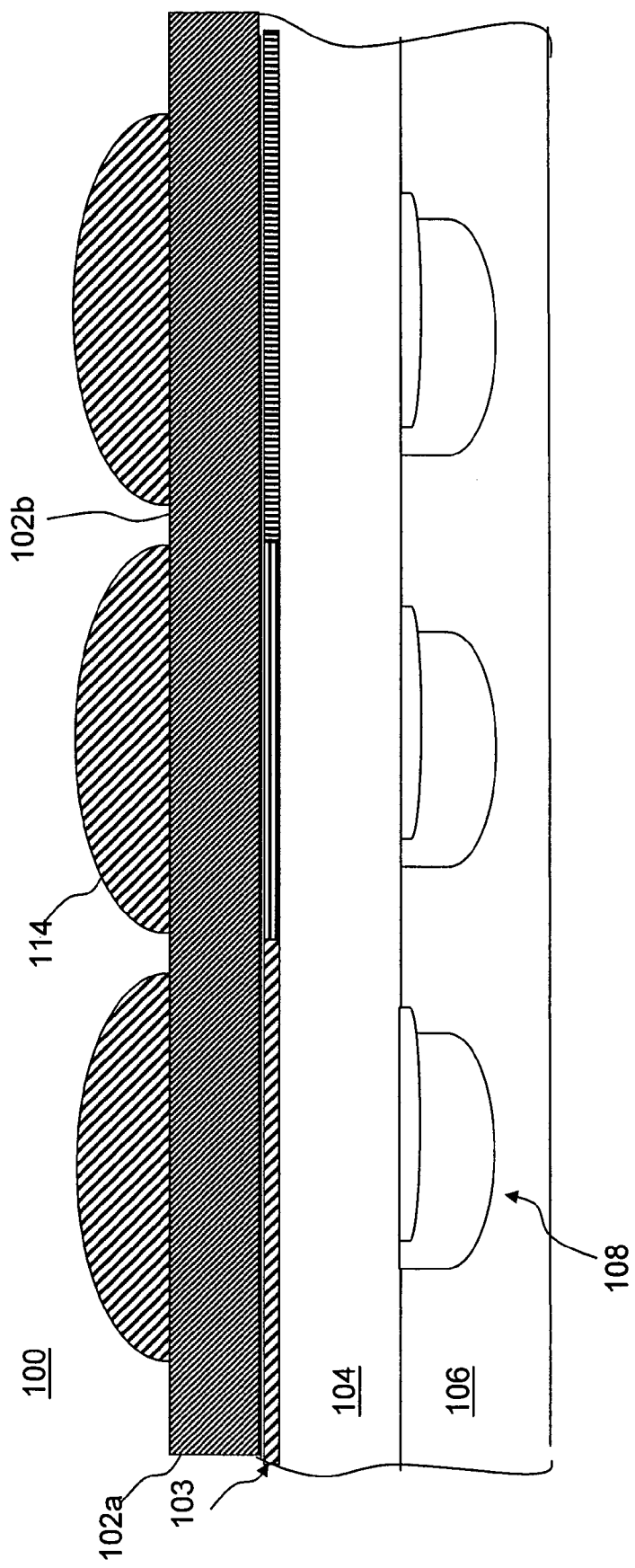

FIG. 4 illustrates a plurality of shaped protective layers 114 formed from the protective material layers 112 (FIG. 3) that flows into a solidly, cross-linked polymer, upon reflow, and that is impervious to subsequent reflow processes. During a reflow process conducted under reflow conditions, a substantially rectangular configuration of the protective material layers 112 (FIG. 3) is transformed into the shaped protective layers 114, which has a somewhat rectangular configuration with rounded edges and a curved top.

Figure 5:
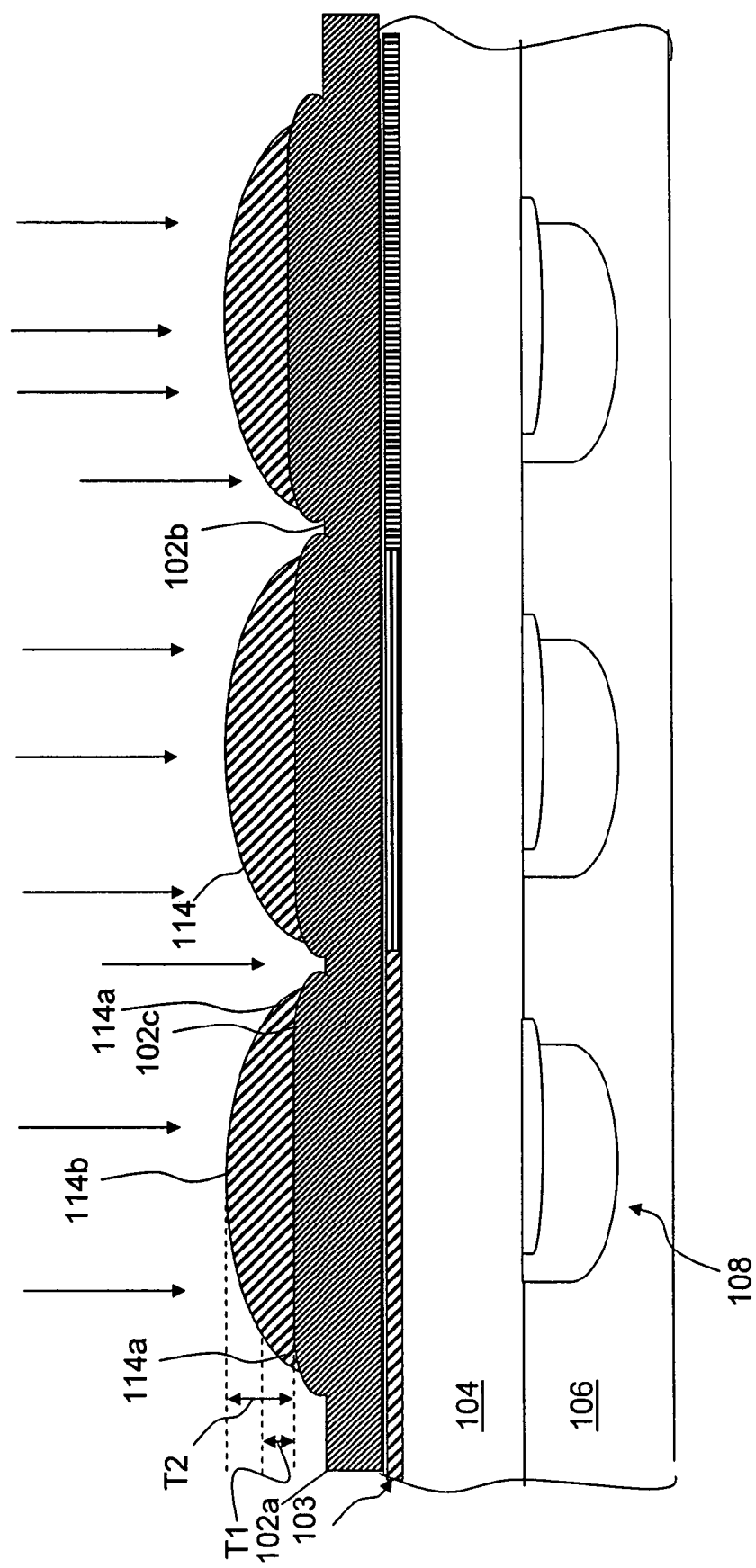

FIG. 5 illustrates an intermediate structure resulting from etching (illustrated by the arrows) the shaped protective layers 114 and the microlens precursor material layer 102a. As illustrated, the shaped protective layers 114 have distal portions 114a on each side of a medial portion 114b; the distal portions 114a have a cross-sectional thickness T1 (measured from a substantially planar portion of the underlying microlens precursor material layer 102a) that is less than the cross-sectional thickness T2 of the medial portion 114b. As a result of the uneven thicknesses T1, T2 of the shaped protective layer 114 (portions 114a, 114b), the underlying microlens precursor material layer 102a is etched at different times at approximately the same rate.

For example, the exposed portions 102b of the microlens precursor material layer 102a will be etched prior to the non-exposed portions 102c of the microlens precursor material layer 102a as the shaped protective layer 114 protects the non-exposed portions 102c of the microlens precursor material layer 102a. As the distal portions 114a of the shaped protective layers 114 are etched away, the underlying microlens precursor material layer 102a becomes exposed, and is etched at approximately the same rate as the shaped protective layer 114 and exposed portions 102b of the microlens precursor material layer 102a. The previously unexposed portions 102c of the microlens precursor material layer 102a assume rounded edges as the overlying shaped protective layer 114 is removed by the etching.

Figure 6:
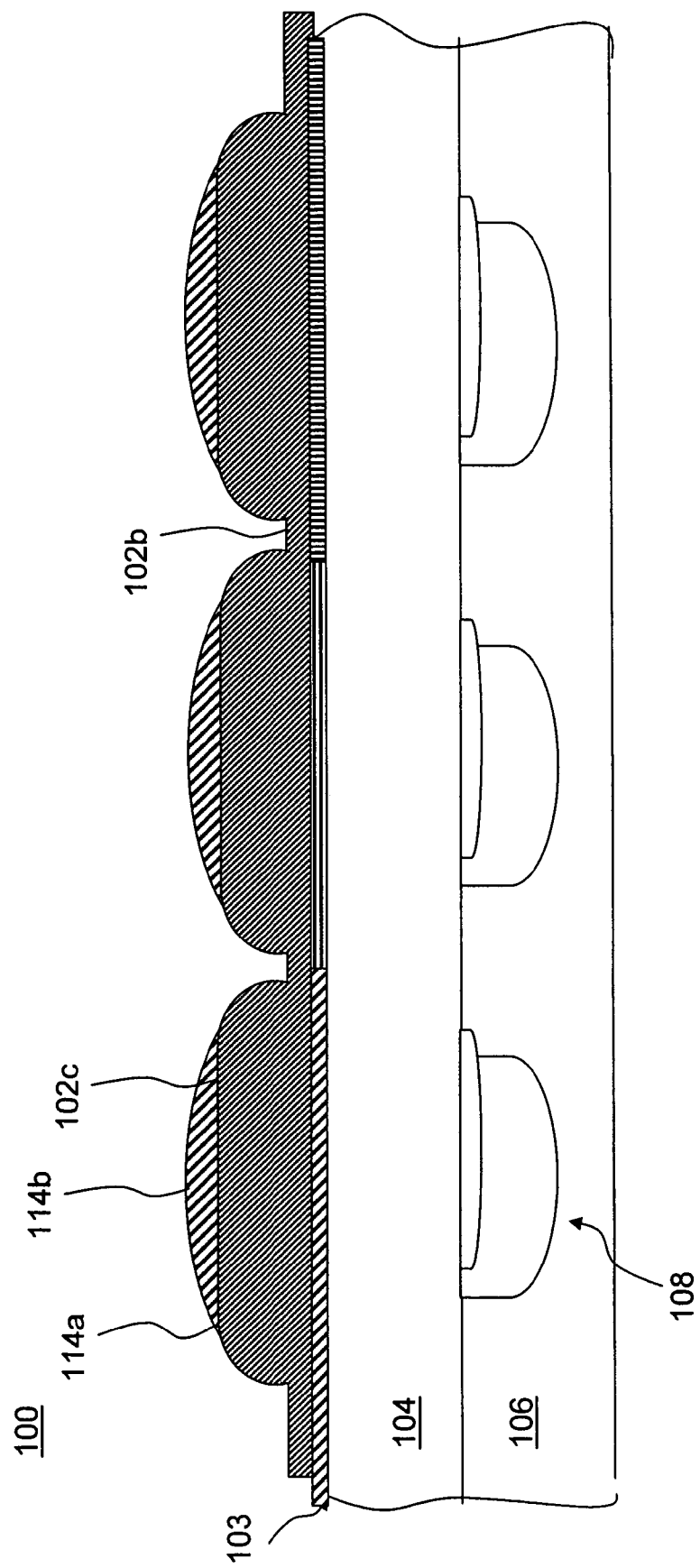

FIG. 6 illustrates a further stage of etching the FIG. 5 intermediate structure. The microlens precursor material layer 102a is continually etched such that unexposed portions 102c of the microlens precursor material layer 102a begin to take on substantially the same shape as the overlying shaped protective layers 114. The exposed portions 102b of the microlens precursor material layer 102a are nearly entirely removed, and a majority of the shaped protective layers 114 is also nearly removed.

The FIG. 6 intermediate structure is further etched to substantially remove the shaped protective layers 114, and produce the structure illustrated in FIG. 1B. The intermediate structure may also be etched to create exposed portions 103a (FIG. 1B) of the color filter array 103(FIG. 1B) between adjacent microlenses 101 (FIG. 1B) in the microlens array 102 (FIG. 1B). It should be noted that exposing a surface 103a (FIG. 1B) of the color filter array 103(FIG. 1B) is optional, and not intended to be limiting in any way.

Figure 7:
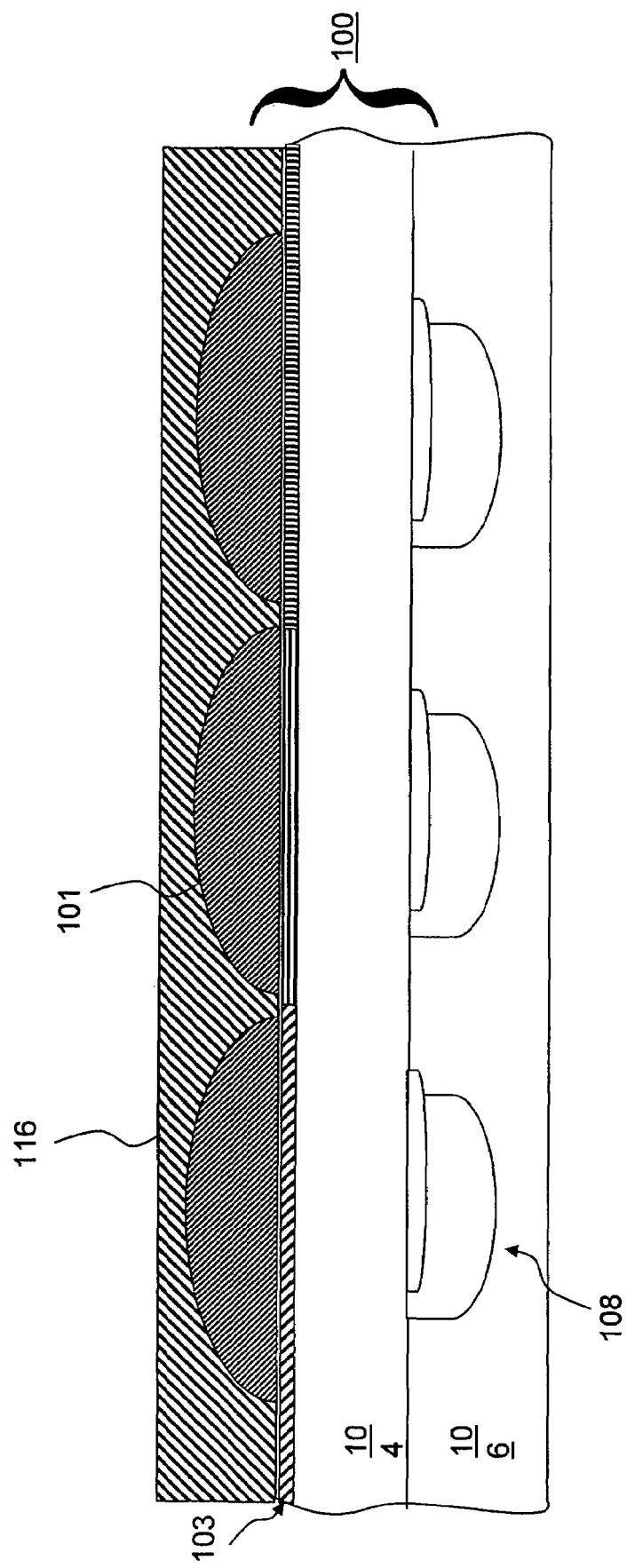
FIGS. 7-8 illustrate partial side cross-sectional views of the imager illustrated in FIGS. 1A and 1B after additional material layers are added.

FIG. 7 illustrates the FIG. 1B imager 100 having an optional material layer 116 formed over the microlenses 101. The material layer 116 could be formed of any transparent material including, but not limited to, zinc selenide (ZnSe), silicon oxide, silicon nitride, silicon oxynitride, silicon-carbon (SiC) (BLOK), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, polyester acrylate, or a positive or negative photoresist such as a 3000 series photoresist material (or any other series of photoresist material) produced by FUJIFILM Electronic Materials (FFEM), Japan, including, but not limited to color resists known in the art as SB-3000L, SG-3000L and SR-3000L for blue, green, and red color filters, respectively. The material layer 116 could also be formed of a material including, but not limited to, glass, for example, zinc selenide (ZnSe), boro-phospho-silicate glass (BPSG), phosphosilicate glass (PSG), borosilicate glass (BSG), silicon oxide, silicon nitride, or silicon oxynitride; an optical thermoplastic material such as tantalum pentoxide (Ta2O5), titanium oxide (TiO2), polymethylmethacrylate, polycarbonate, polyolefin, cellulose acetate butyrate, or polystyrene; a polyimide; a thermoset resin such as an epoxy resin; a photosensitive gelatin; or a radiation curable resin such as acrylate, methacrylate, urethane acrylate, epoxy acrylate, or polyester acrylate.

The material layer 116 can be formed as a protective layer and provide a substantially planar surface to the imager 100 illustrated in FIGS. 1A and 1B for easier handling of the imager 100 illustrated in FIGS. 1A and 1B in subsequent processing steps, such as, but not limited to, insertion of the imager 100 (FIG. 1) into a processor system, such as a digital camera, discussed below with respect to FIG. 18. The material layer 116 can also be formed as a substantially planar surface for additional material layers.

Figure 8:
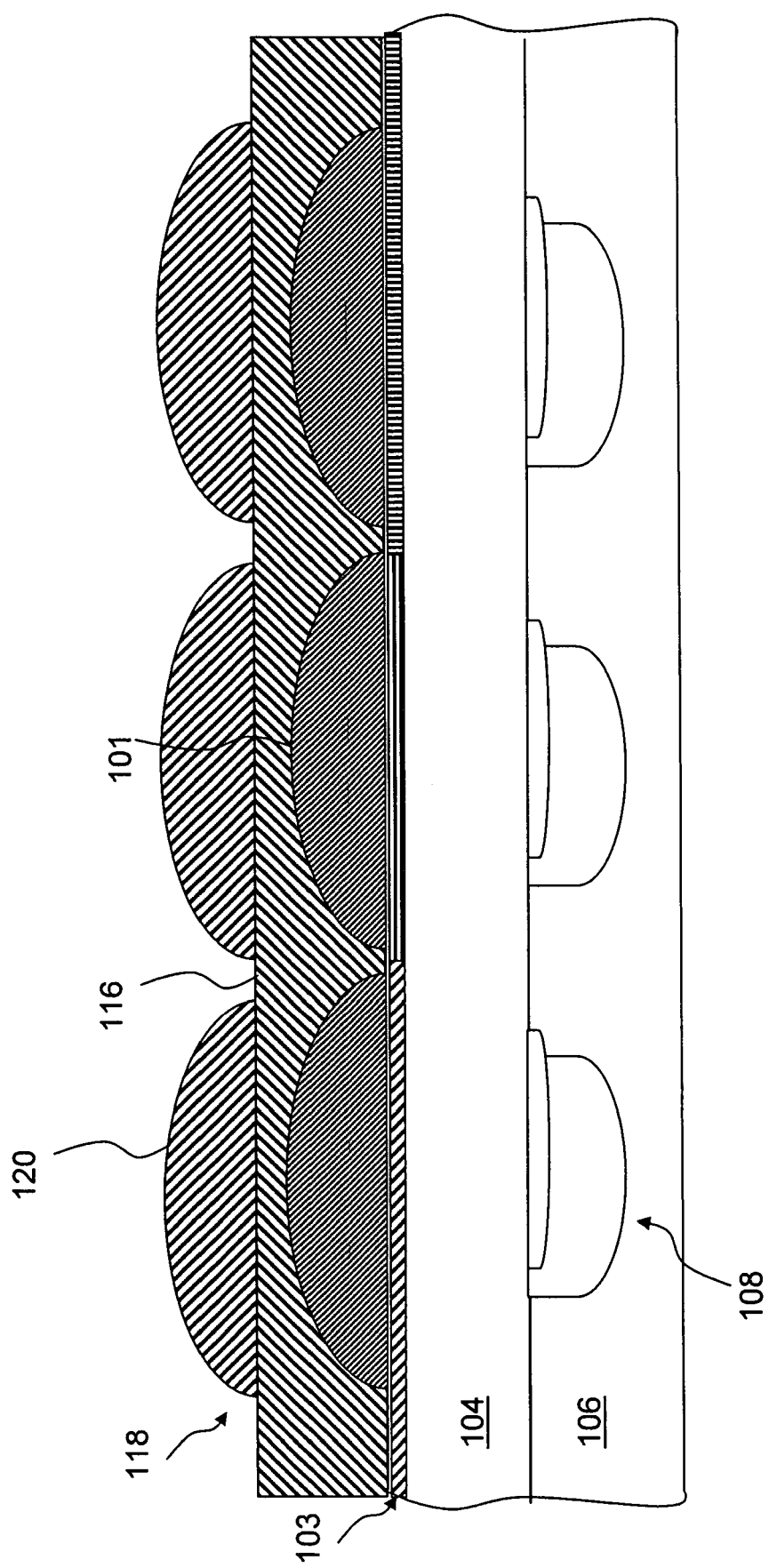

For example, as illustrated in FIG. 8, an optional second microlens array 118 is provided over the material layer 116. The microlens array 118 includes a plurality of second microlenses 120 over the array of microlenses 102 (e.g., FIG. 1B).

The second microlens array 118 is shaped to substantially direct light towards the photosensors 108. The second microlens array 118 is formed in substantially the same manner as the shaped protective layers 114 discussed above with respect to FIGS. 2-4. It should be noted that the second microlens array 118 is only optional, and is not intended to be limiting in any way.

Figure 9:
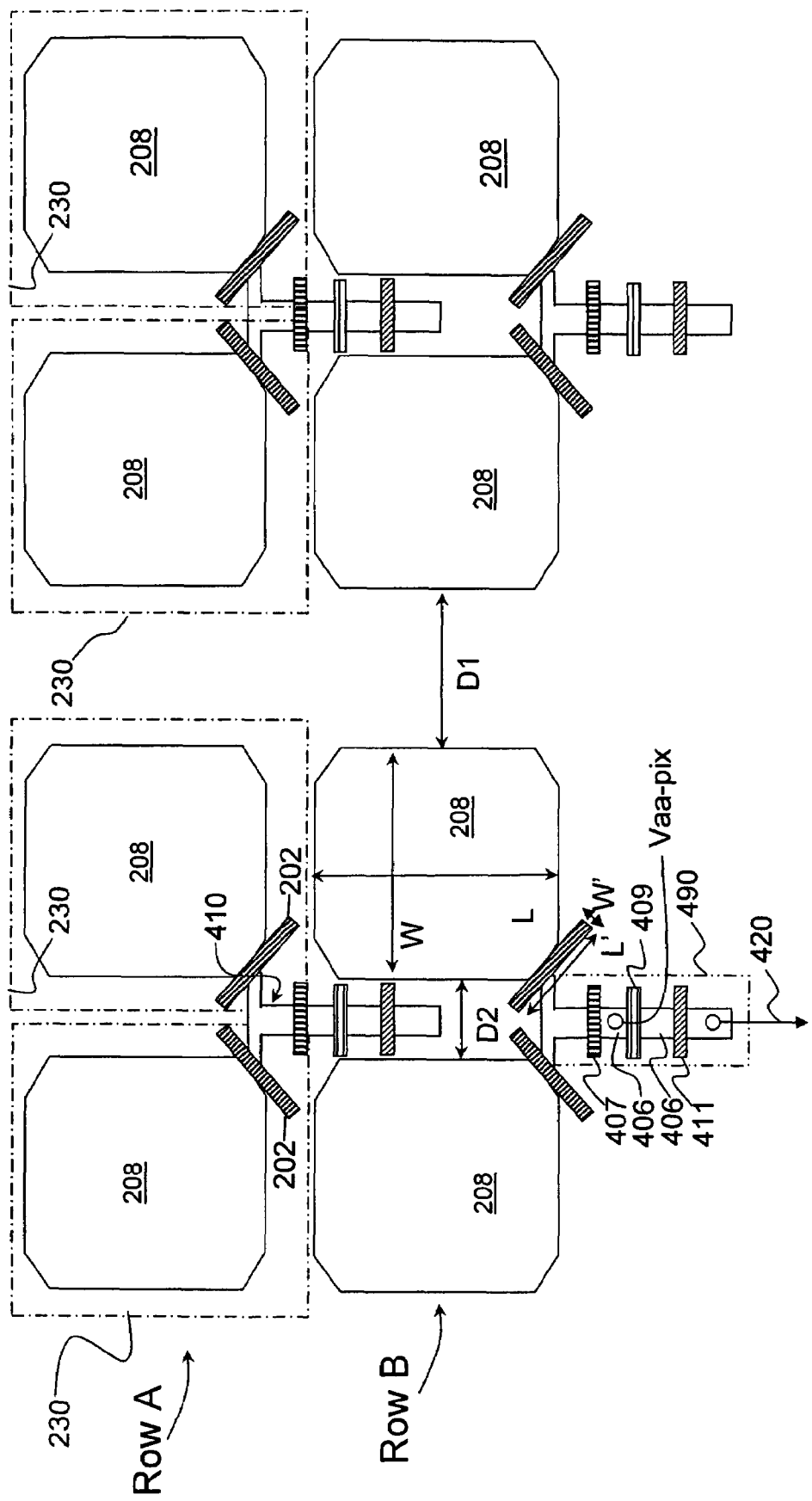
FIG. 9 illustrates a partial top-down view of an imager constructed in accordance with a second embodiment discussed herein.

FIG. 9 illustrates a top-down magnified portion of eight pixel cells 230 arranged as four two-way shared pixel cells. As illustrated, two adjacent pixel cells 230 in one row (e.g., Row A) of the array share common pixel components. In addition, each pixel cell 230 has an individual photosensor 208. The photosensors 208 may be any photosensitive structure for converting light photons into electrons (photocharges). For a CMOS imager, each pixel cell 230 may have a respective transfer gate 202 as part of a respective transfer transistors for transferring the accumulated photo-charges from the photosensors 208 to a common storage node, shown as floating diffusion region 410.

The transfer gates 202 are angled from the photosensors 208. For example, the longitudinal extent L' of the transfer gates 202 is illustrated as being slanted with respect to the length L and the width W of the associated photosensors 208. The angular geometry of the transfer gate 202 allows for an efficient layout of the length L' and width W' of the transfer gate 102, which may improve the leakage and lag performance of the pixel 230. In addition, the angular layout is also beneficial in maximizing the fill factor of the pixel cell array, by maximizing the area of the photosensor 208 for each pixel cell 230.

The remaining pixel cell read out components shared between the adjacent pixel cells 230 are illustrated as being on a shared trunk 490, which is located between two column-adjacent pixel cells of a row, and also between pairs of row adjacent pixel cells of a row (e.g., Row B). The shared components on the trunk 490 include a floating diffusion region 410, which serves as a common storage node for the pixel cells 230 for receiving charges from photosensors 208 by the transfer gates 102. A reset transistor having a gate 407 is located on a side of the floating diffusion region 410 opposite the photosensors 208. A source/drain region 406 is located on a second side of the reset transistor gate 407, which is capable of receiving a supply voltage $V_{aa\text{-}pix}$. The floating diffusion region 410 is also electrically connected to the gate 409 of a source follower transistor, which has a drain coupled to the supply voltage $V_{aa\text{-}pix}$. The source follower transistor creates a voltage output signal based on stored charge on the floating diffusion region 410. A row select transistor having a gate 411 has a source/drain connected to the source of the source follower transistor, for selectively reading out the pixel signal to a column line 420.

Figure 10:
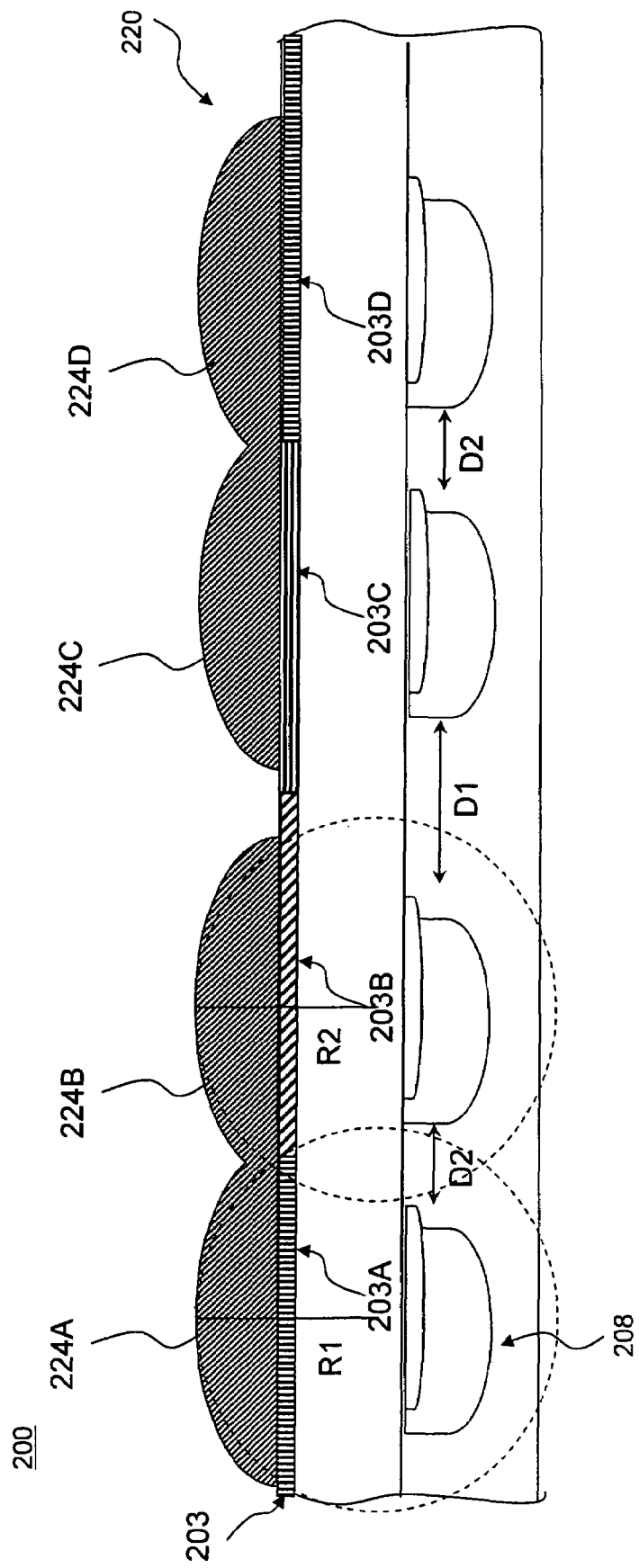
FIG. 10 illustrates a partial side cross-sectional view of the FIG. 9 imager.

The FIG. 9 photosensors 208 are provided with microlenses (e.g., first, second, third, and fourth microlenses 224A, 224B, 224C, 224D of FIG. 10) that are shifted to accommodate the shared pixel cell (e.g., 230) layout. As illustrated in FIGS. 9 and 10, two adjacent shared pixel cells 230 are closer in proximity (illustrated as D2) than are two adjacent non-shared pixel cells 230 (illustrated as D1); accordingly, the microlenses (e.g., first, second, third, and fourth microlenses 224A, 224B, 224C, 224D of FIG. 10) must be formed in closer proximity to one another, and may overlap such that the focal points of the microlenses are on the photosensors 208 of each pixel cell 230.

FIG. 10 illustrates a side cross-sectional view of an imager 200 constructed in accordance with a second embodiment. The imager 200 includes the FIG. 9 pixel cell array having shifted pixel cells 230. The imager 200 also includes a microlens array 220 having first, second, third, and fourth microlenses 224A, 224B, 224C, 224D. The first, second, third, and fourth microlenses 224A, 224B, 224C, 224D are formed over a color filter array 203 having first, second, third, and fourth color filters 203A, 203B, 22C, 203D, each color filter filtering a particular wavelength of light to pass to the underlying photosensors 208. Each color filter may be independently selected to allow only certain wavelengths to pass through. For example, the color filters 224A, 224B, 224C, 224D could be selected to allow wavelengths of light associated with a particular color, such as, for example, blue, green, red, cyan, magenta, or yellow. The preceding colors are only examples, and are not limiting in any way.

The first, second, third, and fourth microlenses 224A, 224B, 22C, 224D are formed such that at least two of the microlenses (e.g., first and second microlenses 224A, 224B) are formed such that the two microlenses are a single unit having two radii (R1 and R2) as measured from topmost portions of the microlenses. Additionally, the microlenses could have a more curved or planar shape, as discussed below with respect to FIG. 16. The microlenses are shaped as a single unit such that the wavelengths of light incident on the microlenses are substantially focused onto the underlying shifted photosensors 208. The proximity of two adjacent microlenses (e.g. first and second microlenses 224A, 224B) allows the underlying photosensors 208 to be in closer proximity than compared with microlenses that are formed individually, such as microlenses 101 illustrated in FIGS. 1A and 1B.

Figure 11:
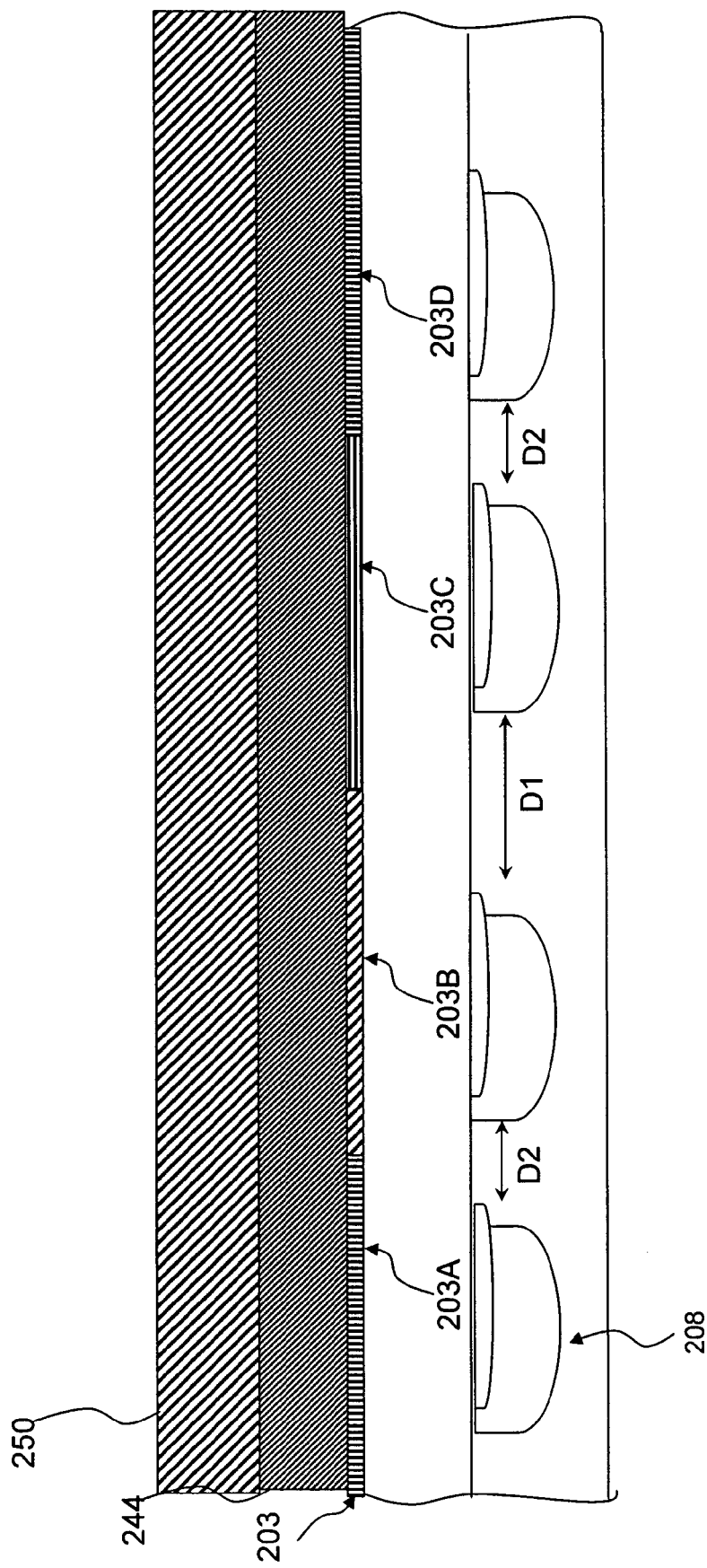
FIGS. 11-15 illustrate an embodiment of fabricating the FIG. 9 imager.

FIGS. 11-15 illustrate partial side cross-sectional views of an embodiment of fabricating the FIG. 10 imager 200. As illustrated in FIGS. 11-15, the fabrication of the FIG. 10 imager 200 is substantially similar to the fabrication of the imager 100 illustrated in FIGS. 1A and 1B (illustrated in FIGS. 2-6). FIG. 11 illustrates the deposition of a microlens precursor material layer 244 over the color filter array 203. The microlens precursor material layer 244 is formed of any transparent material that allows wavelengths of light to pass through, as discussed above with respect to FIG. 2. A protective material layer precursor 250 is formed over the microlens precursor material layer 244. The protective material layer precursor 250 is formed of a photo resist material, and exposed to ultraviolet (UV) radiation using a suitable mask, as discussed above with respect to FIGS. 2-3.

Figure 12:
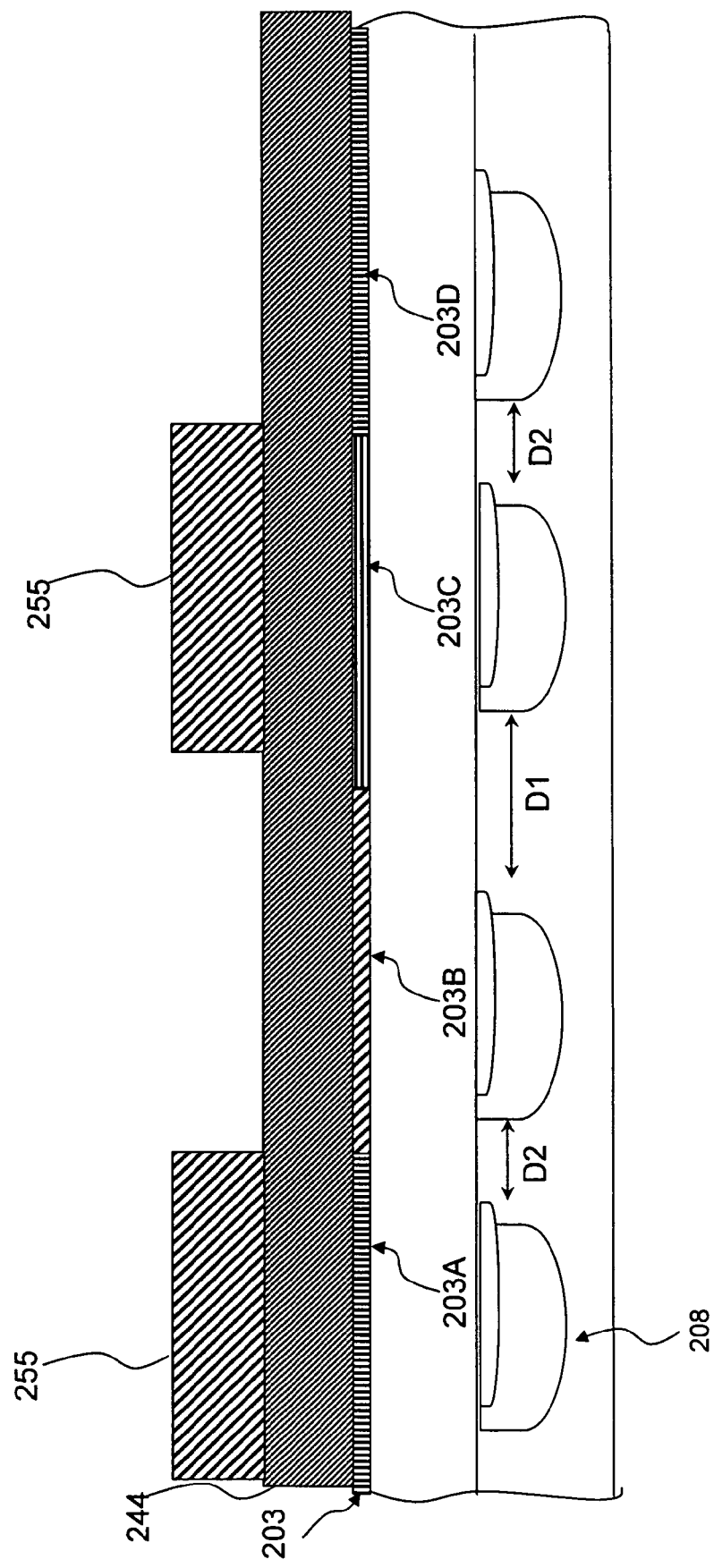

FIG. 12 illustrates a side cross-sectional view of a step in fabricating the FIG. 10 imager 200. The protective material layer precursor 250 (FIG. 11) is patterned such that a first protective material layers 255 is formed over only one of two shared pixel photosensors 208.

Figure 13:
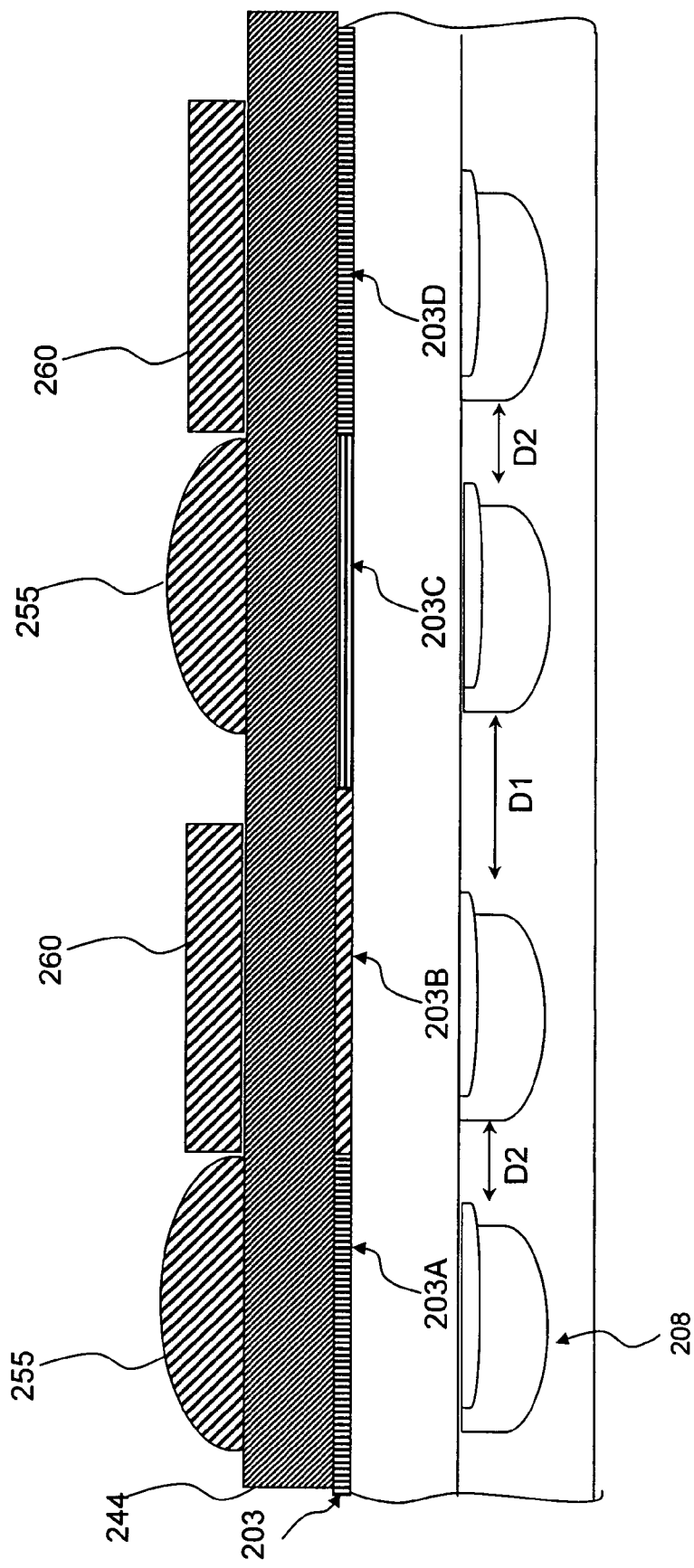

FIG. 13 illustrates the first protective material layers 255 reflowed under first reflow conditions to form a curved shape. The first protective material layers 255 are subsequently cured such that the first protective material layers 255 are substantially immune from subsequent reflow processes. FIG. 13 further illustrates a second protective material layer 260. The second protective material layer is formed by depositing a second protective material layer precursor (not shown) between the first protective material layers 255 after reflow of the first protective material layers 255. The second protective material layer precursor (not shown) is patterned over the other of the two shared photosensors 208 (i.e., the photosensor 208 that the first protective material layer 255 is not formed over) to form a second protective material layers 260.

Figure 14:
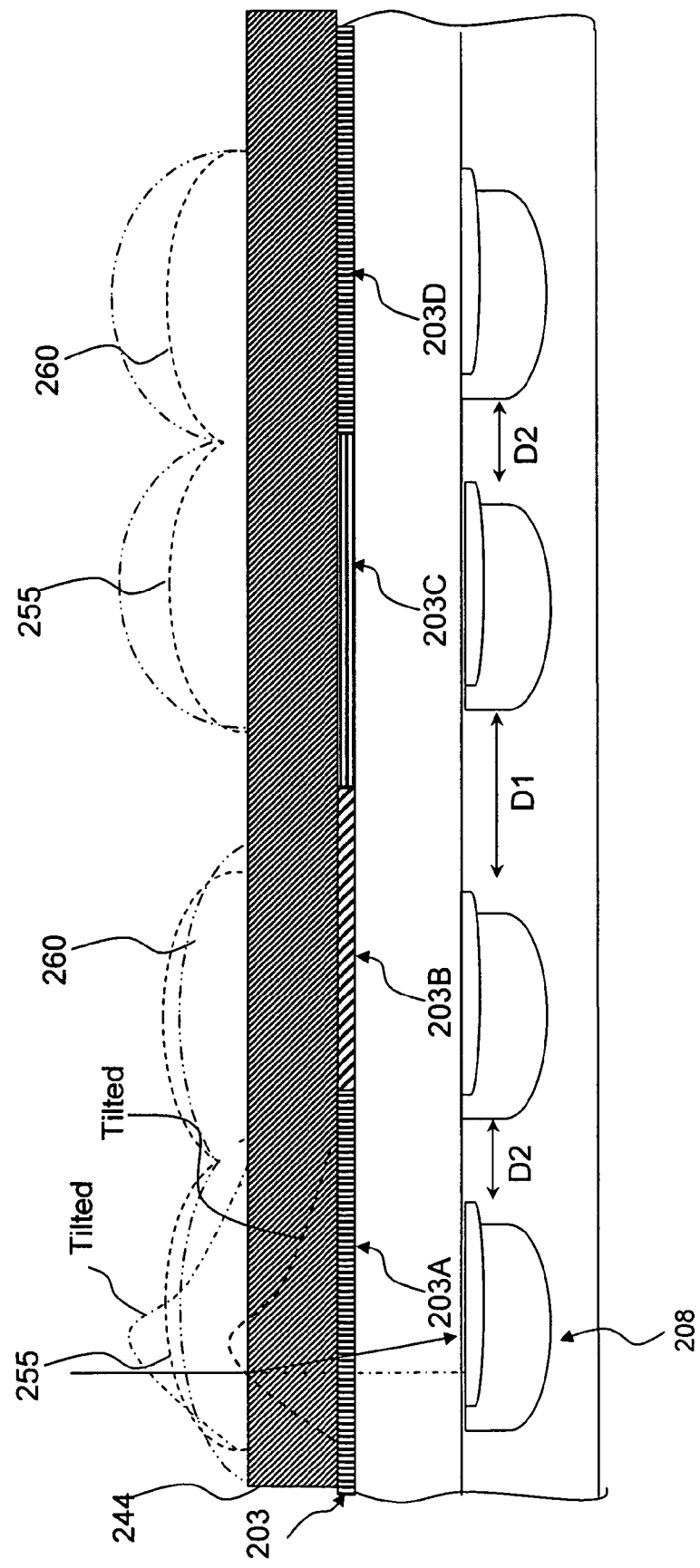

FIG. 14 illustrates the second protective material layers 260 subsequently reflowed at a second reflow condition that can be different from or the same as the first reflow condition to form a curved shape similar to the first protective material layer 255. The reason for forming the first and second protective material layers 255, 260 separately is to prevent any bridging between the first and second protective material layers 255, 260 if the two were formed simultaneously. Additionally, the shapes of the first and second protective material layers 255, 260 can be individually selected (as illustrated by the dotted lines in FIG. 14) by forming the first and second protective material layers 255, 260 separately. Further modifications can be made by tilting the wafer upon which the entire imager 200 (FIG. 10) is fabricated to shift the curvature of the first and second protective material layers 255, 260 to one side or the other (also illustrated in dotted lines in FIG. 14). When etching the underlying microlens precursor material layer 244, the resulting microlens (e.g., 101 of FIG. 1B) could have a shifted focal point by which wavelengths of light striking the top surface of the microlens at an orthogonal angle does not strike a corresponding photosensor at an orthogonal angle after passing through the microlens. By adjusting or modifying the first and second protective material layers 255, 260, the underlying microlens precursor material layer 244 can also be modified accordingly.

Figure 15:
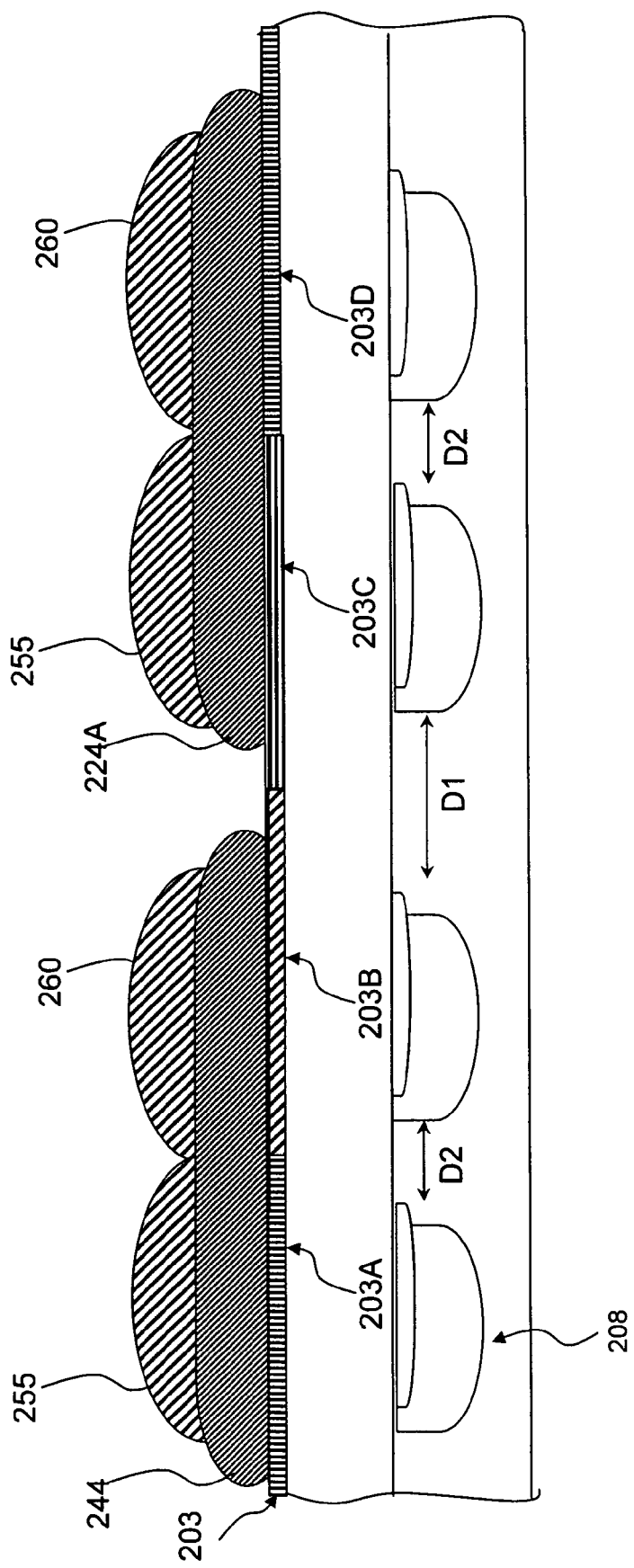

FIG. 15 illustrates the removal of the first and second protective material layers 255, 260 and the microlens precursor material layer 244. Similar to the process of fabricating the imager 100 illustrated in FIGS. 1A and 1B, the first and second protective material layers 255, 260 and the microlens precursor material layer 244 are etched at a substantially similar rate such that the underlying microlens precursor material layer 244 assumes the curved shape of the overlying first and second protective material layers 255, 260. As discussed above with respect to FIG. 14, the curved shape of the first and second protective material layers 255, 260 can be modified such that the microlens precursor material layer 244 assumes the modified curved shape of the first and second protective material layers 255, 260. The FIG. 15 structure is further etched to remove substantially all of the first and second protective material layers 255, 260 to arrive at the FIG. 10 imager 200.

During etching of the first and second protective material layers 255, 260 and the microlens precursor material layer 244, the etch rate and selectivity can be modified such that the first and second protective material layers 255, 260 are etched at a first etch rate and the microlens precursor material layer 244 is etched at a second etch rate, the first and second etch rates being substantially different.

Figure 16:
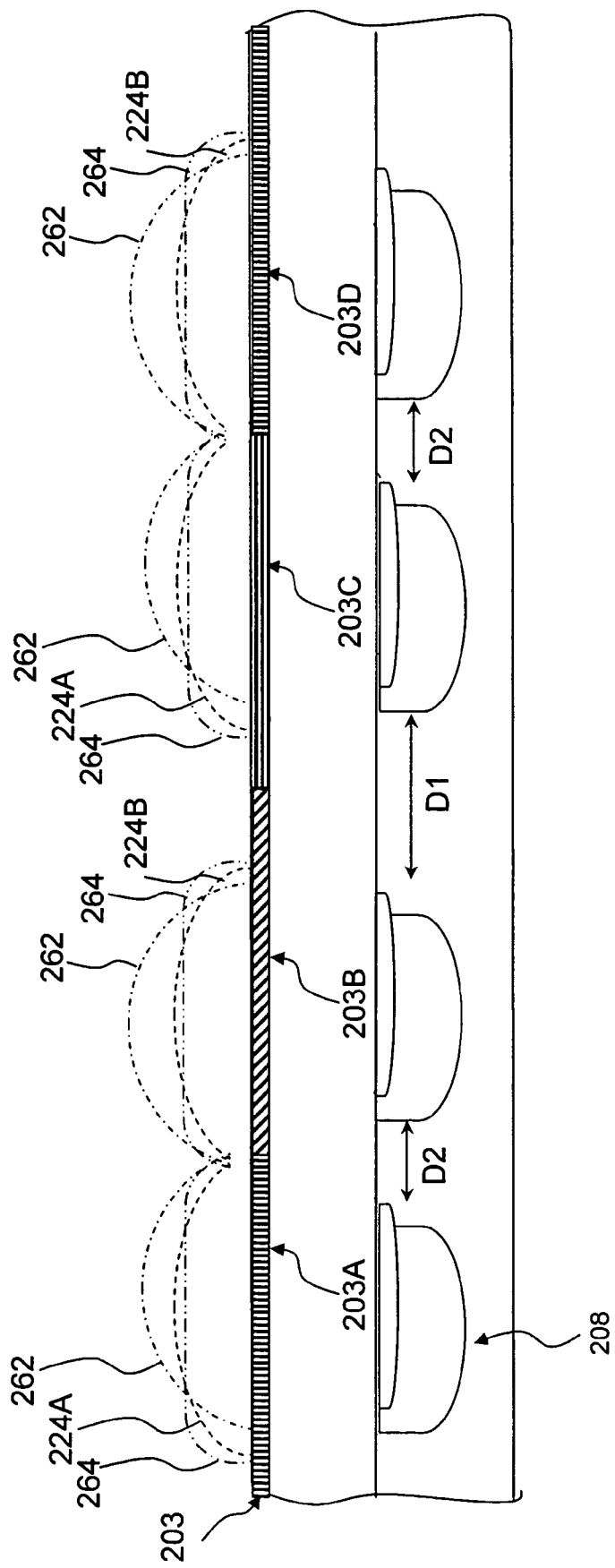
FIG. 16 illustrates a partial side cross-sectional view of alternative embodiments of the FIG. 9 imager.

For example, FIG. 16 illustrates how modifying the selectivity of the etch process can form a myriad of shapes. The etch selectivity for the first and second protective material layers 255, 260 (FIG. 15) can be selected to be greater than the etch selectivity for the microlens precursor material layer 244 (FIG. 15) resulting in microlenses 264 having a planar topmost surface. Alternatively, the etch selectivity for the first and second protective material layers 255, 260 (FIG. 15) can be selected to be less than the etch selectivity for the microlens precursor material layer 244 (FIG. 15) resulting in microlenses 262 having a radius of curvature less than the radius of curvature of microlenses 224A and 224B of FIG. 10.

Figure 17:
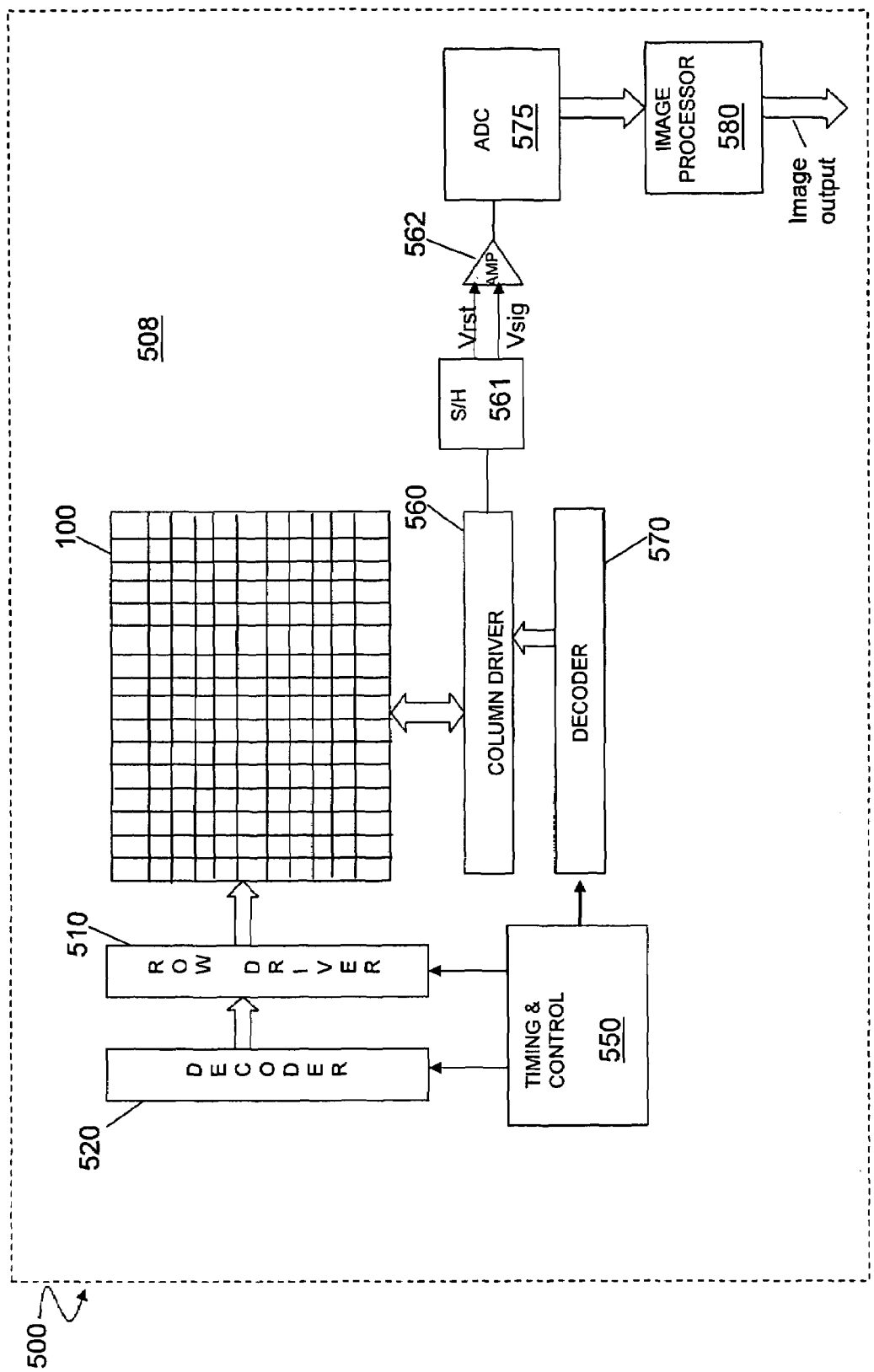
FIG. 17 is a block diagram of an imaging device incorporating the imager illustrated in FIGS. 1A and 1B.

FIG. 17 illustrates an imaging device 508 incorporating an imager 100, 200 constructed in accordance with embodiments of the invention.

In operation of the FIG. 17 imaging device 508, the photosensors 108 (e.g., FIG. 1A) of each row in the imager 100 are all turned on at the same time by a row select line, and the photosensors 108 of each column are selectively output by respective column select lines. A plurality of row and column lines are provided for the entire array. The row lines are selectively activated in sequence by the row driver 510 in response to row address decoder 520 and the column select lines are selectively activated in sequence for each row activation by the column driver 560 in response to column address decoder 570. Thus, a row and column address is provided for each photosensor 108 (e.g., FIG. 1A). The imaging device 508 is operated by the control circuit 550, which controls address decoders 520, 570 for selecting the appropriate row and column lines for pixel readout, and row and column driver circuitry 510, 560, which apply driving voltage to the drive transistors of the selected row and column lines.

The pixel output signals typically include a pixel reset signal $V_{rst}$ taken off of the floating diffusion region (via the source follower transistor) when it is reset and a pixel image signal $V_{sig}$, which is taken off the floating diffusion region (via the source follower transistor) after charges generated by an image are transferred to it. The $V_{rst}$ and $V_{sig}$ signals are read by a sample and hold circuit 561 and are subtracted by a differential amplifier 562, which produces a difference signal ($V_{rst}$–$V_{sig}$) for each photosensor 108 (e.g., FIG. 1A), which represents the amount of light impinging on the photosensor 108 (e.g., FIG. 1A). This signal difference is digitized by an analog-to-digital converter (ADC) 575. The digitized pixel signals are then fed to an image processor 580 to form a digital image output. In addition, as depicted in FIG. 17, the imaging device 508 may be included on a single semiconductor chip (e.g., chip substrate 500).

Figure 18:
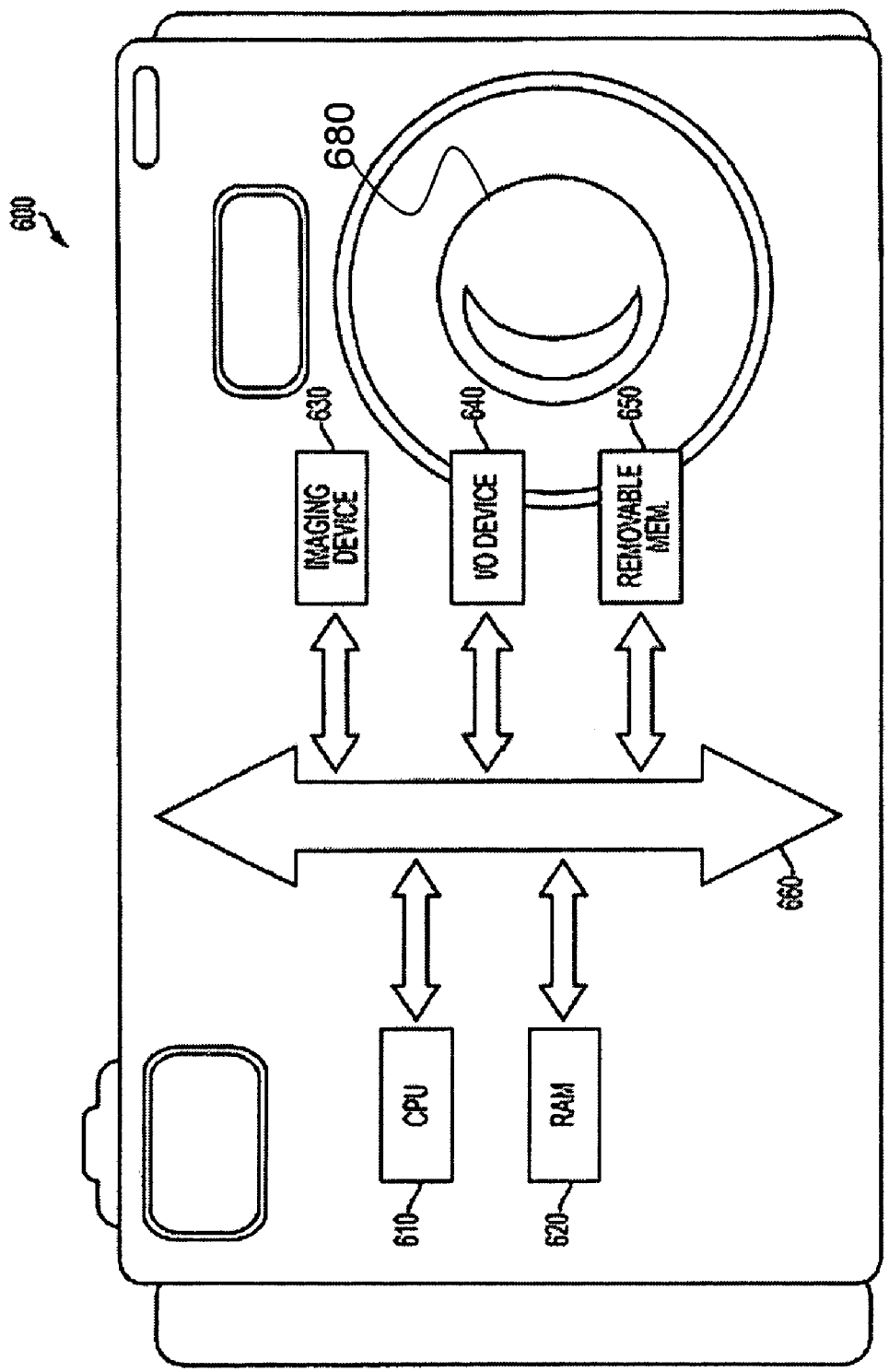
FIG. 18 is a schematic diagram of a processor system incorporating the FIG. 17 imaging device in accordance with an embodiment discussed herein.

FIG. 18 shows a typical system 600, such as, but not limited to, a camera. The system 600 is modified to include an imaging device (such as the FIG. 17 imaging device 508). The system 600 is an example of a system having digital circuits that could include image sensor devices. Without being limiting, such a system could include a computer system, camera system, scanner, machine vision, vehicle navigation system, video phone, surveillance system, auto focus system, star tracker system, motion detection system, image stabilization system, and other systems employing an imager.

System 600, for example, a camera system, includes a lens 680 for focusing an image on imager 100, and generally comprises a central processing unit (CPU) 610, such as a microprocessor that controls camera functions and image flow, and communicates with an input/output (I/O) device 640 over a bus 660. CMOS imager device 508 also communicates with the CPU 610 over the bus 660. The processor-based system 600 also includes random access memory (RAM) 620, and can include removable memory 650, such as flash memory, which also communicate with the CPU 610 over the bus 660. The imaging device 508 may be combined with the CPU 610, with or without memory storage on a single integrated circuit or on a different chip than the CPU.

It should again be noted that although the embodiments have been described with specific references to CMOS imaging devices (e.g., 100, 200 of FIGS. 1-16), they have broader applicability and may be used in any imaging apparatus. For example, embodiments may be used in conjunction with charge coupled device (CCD) imagers. The above description and drawings illustrate embodiments which achieve the objects, features, and advantages described. Although certain advantages and embodiments have been described above, those skilled in the art will recognize that substitutions, additions, deletions, modifications and/or other changes may be made.

What is claimed as new and desired to be protected by Letters Patent of the United States is:

1. A method of forming an image sensor, comprising:
    forming a microlens precursor material layer over a substrate having at least one photosensor formed thereon;
    forming a shaping layer having a predetermined shape over the microlens precursor material layer, the shaping layer being substantially aligned over the at least one photosensor;
    removing the shaping layer and portions of the microlens precursor material layer such that the microlens precursor material layer forms a microlens having a shape substantially similar to the predetermined shape of the shaping layer;
    forming a material layer over the microlens; and
    forming a second microlens over the material layer.

2. The method of claim 1, wherein the material layer has a substantially planar surface.

3. The method of claim 1, wherein the microlens precursor material layer is formed over an entire surface of the substrate.

4. The method of claim 1, wherein the predetermined shape is substantially spherical.

5. The method of claim 4, wherein sidewalls of the resulting microlens are slightly sloped downward.

6. A method of forming an image sensor, comprising:
    forming a microlens precursor material layer over a substrate having at least one photosensor formed thereon;
    forming a shaping layer having a predetermined shape over the microlens precursor material layer, the shaping layer being substantially aligned over the at least one photosensor;
    removing the shaping layer and portions of the microlens precursor material layer such that the microlens precursor material layer forms a microlens having a shape substantially similar to the predetermined shape of the shaping layer;
    forming a material layer over the microlens; and
    forming a color filter below the microlens, wherein the color filter has a characteristic that allows a predetermined wavelength of light to pass through.

7. The method of claim 6, wherein the wavelength of light allowed to pass through is selected from the group consisting of red, green, and blue.

8. A method of forming a microlens, comprising:
    forming a microlens precursor material layer over a substrate having at least one photosensor formed thereon;
    forming a shaping layer having a predetermined shape over the microlens precursor material layer, the shaping layer being substantially aligned over the at least one photosensor;
    etching the shaping layer and portions of the microlens precursor material layer such that the microlens precursor material layer forms a microlens having a shape substantially similar to the predetermined shape of the shaping layer, wherein the etching step comprises:
    performing a first etch at a first predetermined etch rate; and
    performing a second etch at a second predetermined etch rate.

9. The method of claim 8, wherein the first predetermined etch rate is faster than the second predetermined etch rate.

10. The method of claim 8, wherein the first predetermined etch rate is slower than the second predetermined etch rate.

11. A method of forming an array of microlenses, comprising:
    patterning a first set of shaping layer precursors onto a microlens precursor material layer formed over a pixel cell array having at least one photosensor spaced unequally from adjacent photosensors;
    reflowing the first set of shaping layer precursors under first reflow conditions;

curing the first set of shaping layer precursors to form first shaping layers;

patterning a second set of shaping layer precursors onto the substrate;

reflowing the second set of shaping layer precursors;

curing the second set of shaping layer precursors to form second shaping layers; and etching the first and second sets of shaping layers and the microlens precursor material layer such that the microlens precursor material layer forms the array of microlenses over a corresponding color filter array, the microlenses having a shape substantially similar to a predetermined shape of the shaping layer, wherein the microlenses have a shifted focal point with respect to the photosensors relative to a focal point of a symmetrical lens.

12. The method of claim 11, wherein the first and second sets of shaping layers are substantially removed from the underlying microlens precursor material layer.

13. The method of claim 11, wherein the microlens precursor material layer is etched to expose portions of the color filter array between the resulting microlenses.

14. The method of claim 11, wherein the etching step comprises:

performing a first etch at a first predetermined etch rate and performing a second etch at a second predetermined etch rate.

15. The method of claim 14, wherein the first predetermined etch rate is faster than the second predetermined etch rate.

16. The method of claim 14, wherein the first predetermined etch rate is slower than the second predetermined etch rate.

17. A method of forming a microlens, comprising:

forming a microlens precursor material layer over a substrate having photosensors formed therein;

forming a protective material layer over the microlens precursor material layer;

shaping the protective material layer such that a medial portion of the protective material layer has a side cross-sectional thickness greater than a side cross-sectional thickness of at least one distal portion of the protective material layer;

etching the protective material layer and the microlens precursor material layer such that the at least one distal portion of the protective material layer is removed prior to the removal of the medial portion of the protective material layer resulting in an uneven removal rate of the underlying microlens precursor material layer; and continuing to etch the protective material layer and the microlens precursor material layer such that the protective material layer is essentially removed, and a resulting microlens has a medial portion having a side cross-sectional thickness greater than a side cross-sectional thickness of at least one distal portion of the microlens.

18. The method of claim 17, wherein a rate of etching the protective material layer and the microlens precursor material layer is varied resulting in microlenses having a substantially planar topmost surface.

19. The method of claim 17, wherein forming the protective material layer comprises depositing a protective material layer precursor over the microlens precursor material layer, patterning the protective material layer precursor, and reflowing the protective material layer precursor such that the protective material layer precursor assumes a curved shape.

20. The method of claim 19, further comprising tilting the microlens precursor material layer during reflow of the protective material layer precursor such that the curvature of the resulting protective material layer is shifted from a center point.

21. A method of forming a microlens array, comprising:

forming a microlens array precursor material layer over a substrate having a plurality of photosensors formed thereon;

forming a shaping layer having a predetermined shape over the microlens array precursor material layer, the shaping layer being substantially aligned over the plurality of photosensors; etching the shaping layer such that the predetermined shape of the shaping layer is substantially transferred to the microlens array precursor material layer to form a microlens array, wherein the etching step comprises;

performing a first etch at a first predetermined etch rate; and performing a second etch at a second predetermined etch rate; and forming a material layer over the microlens array.

* * * * *